United States Patent [19]
Matsuo et al.

[11] Patent Number: 5,823,351
[45] Date of Patent: Oct. 20, 1998

[54] SEMICONDUCTOR CRYSTAL PACKAGING DEVICE

[75] Inventors: Shinichi Matsuo, Kubiki-mura; Nobuyoshi Fujimaki, Annaka; Shiroyasu Watanabe, Kubiki-mura; Kintaro Kato, Tokyo, all of Japan

[73] Assignee: Shin-Etsu Handotai Co., Ltd., Tokyo, Japan

[21] Appl. No.: 617,804

[22] PCT Filed: Jul. 7, 1995

[86] PCT No.: PCT/JP95/01357

§ 371 Date: Mar. 7, 1996

§ 102(e) Date: Mar. 7, 1996

[87] PCT Pub. No.: WO96/02069

PCT Pub. Date: Jan. 25, 1996

[30] Foreign Application Priority Data

Jul. 8, 1994 [JP] Japan .................................. 6-180963

[51] Int. Cl.⁶ .................................................. B65D 85/86
[52] U.S. Cl. .......................................... 206/710; 206/454
[58] Field of Search .................................. 206/710–712, 206/454; 220/4.21, 4.24

[56] References Cited

U.S. PATENT DOCUMENTS

| | | | |
|---|---|---|---|
| 4,043,451 | 8/1977 | Johnson | 206/711 |
| 4,135,625 | 1/1979 | Merrill | 206/711 |
| 4,173,286 | 11/1979 | Stanko | 220/4.24 |
| 4,219,693 | 8/1980 | French | 220/4.24 |
| 4,555,024 | 11/1985 | Voss et al. | 206/454 |
| 4,588,086 | 5/1986 | Coe | 206/711 |
| 4,779,732 | 10/1988 | Boehm et al. . | |
| 4,826,055 | 5/1989 | Tajima et al. | 220/432 |
| 4,966,284 | 10/1990 | Gregerson et al. | 206/711 |
| 5,054,418 | 10/1991 | Thompson et al. | 206/454 |

FOREIGN PATENT DOCUMENTS

| | | | |
|---|---|---|---|
| 416956 | 9/1990 | European Pat. Off. . | |
| 723290 | 7/1996 | European Pat. Off. . | |
| 52-113881 | 9/1977 | Japan . | |
| 55-133533 | 10/1980 | Japan . | |
| 58-046655 | 3/1983 | Japan . | |
| 60-173826 | 9/1985 | Japan . | |
| 1127611 | 9/1968 | United Kingdom | 220/4.24 |

*Primary Examiner*—Jimmy G. Foster
*Attorney, Agent, or Firm*—Evenson, McKeown, Edwards & Lenahan P.L.L.C.

[57] ABSTRACT

A pair of box-like device halves are molded from polyethylene terephthalate or like elastic material. Each device half has a horizontal edge wall having a protuberance and a recess, and also raised guides and recessed guides, and it also has a downwardly convex semiconductor accommodation wall formed between its opposite side walls for accommodating semiconductor crystal. The device half further has legs extending to a greater extent than the arcuate sectional profile outer surface of the semiconductor accommodation wall. Semiconductor crystal is set in one of the device halves, which is then covered by the other device half such that the raised guides and recessed guides of the two device halves engage one another and that the protuberances and recesses engage one another. The semiconductor crystal is thus accommodated in the device halves such that it is pushed by the elastic forces of the semiconductor accommodation walls.

10 Claims, 21 Drawing Sheets

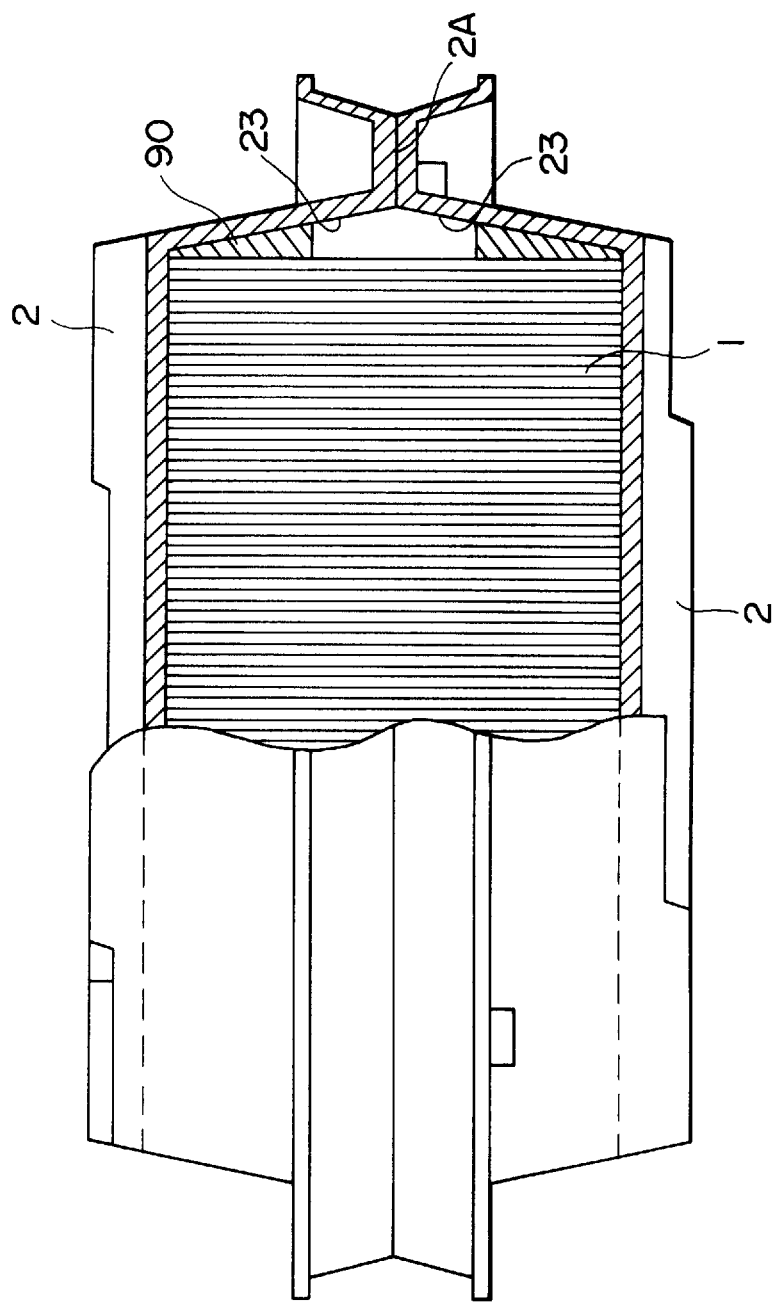

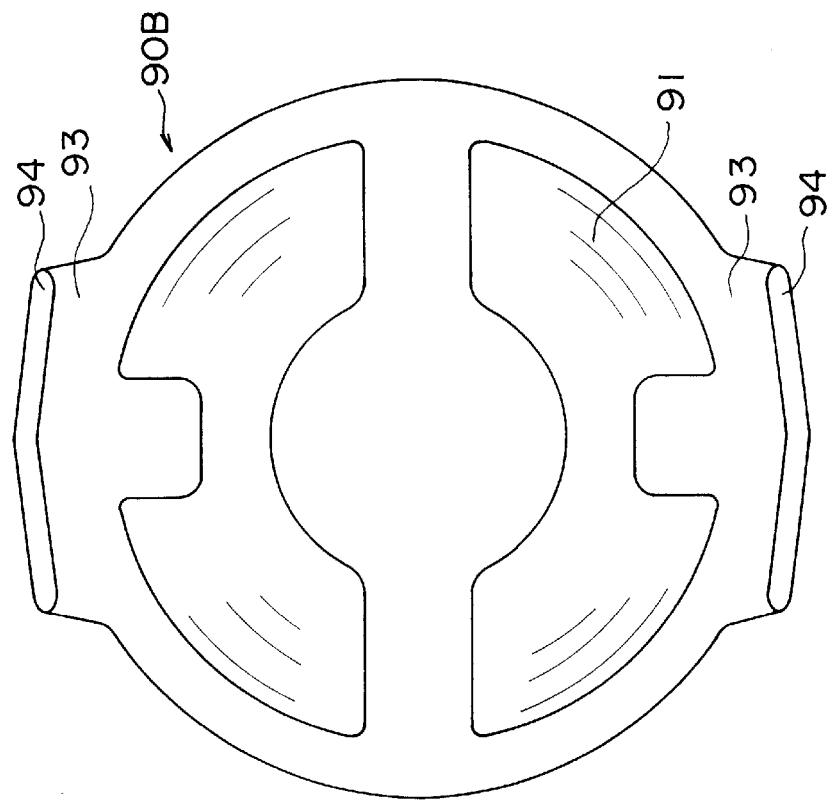
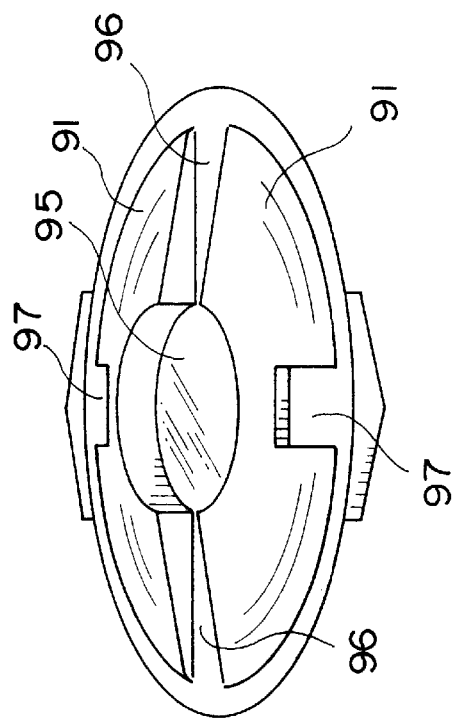

SEMICONDUCTOR CRYSTAL PACKAGING DEVICE

BACKGROUND OF THE INVENTION

1. Field of the Invention

This invention relates to semiconductor crystal packaging devices for storing or transporting semiconductor crystals, such as ingots obtained by grinding grown semiconductor single crystals into a cylindrical shape and semiconductor wafers obtained by cutting the ingot to a predetermined thickness.

2. Prior Art

Semiconductor integrated circuits (ICs) are manufactured by polishing the surfaces of a semiconductor wafer obtained by cutting a semiconductor crystal as material to a predetermined thickness, i.e., about 0.5 mm, fabricating an IC pattern including diodes, transistors, MOS-FETs, resistors, capacitors, etc. on the wafer, covering the wafer surface having the IC pattern with a thin insulating film, and mounting lead terminals of a metal film on the insulating film.

The IC manufacture requires transporting ingots or wafers as semiconductor crystal from one step to another or to a different factory. Ingots are transported in a state that they are secured to styrene foam. However, semiconductor wafers which are obtained by cutting crystal to a predetermined thickness are thin even before polishing, and they have to be stored or transported by taking care so that they will not be broken.

In the prior art, as means for storing or transporting wafers an upper packaging device half and a lower packaging device half are provided as different shape moldings of a hard plastic material, and as means for setting wafers in the lower packaging device half a wafer carrier is separately prepared, which has a downwardly convex wafer support having an inner periphery conforming to the wafer diameter. The wafer carrier is secured in position in the lower device half, then wafers are set in a row in the wafer support of the wafer carrier, and then they are accommodated in the upper and lower device halves together with guard members of styrene foam, urethane, etc., which are provided between the device halves and the wafer surfaces and also between the upper device half ceiling inner surface and the wafer edge to protect the wafers from external shocks.

In a related technique (shown in Japanese Patent Publication No. Showa 55-9349), wafers are accommodated in an upper and a lower device half having different shapes such that they are pushed against the lower device half by the upper device half via a wafer carrier, which is made of a hard but elastically deformable plastic material, and in which the wafers are set upright and in a row at a predetermined interval.

In another related technique (shown in Japanese Patent Laid-Open Publication No. Showa 60-193877), in an upper and a lower device half having different shapes a cage having ribs provided at a predetermined interval for inserting wafers between adjacent ones of these ribs, is provided, and wafers are accommodated such that they are pushed against the cage by the upper device half via a retainer member disposed over the cage.

In a further related technique (shown in Japanese Patent Laid-Open Publication No. Heisei 2-20042), in an upper and a lower device half having different shapes a wafer carrier having ribs provided at a predetermined interval for inserting wafers between adjacent ones of these ribs, is provided, and wafers are accommodated such that they are pushed by a wafer support spring integral with the upper device half.

In the above prior art techniques, grown semiconductor single crystals and ingots obtained by cylindrically polishing the crystals are packed in cardboard by securing the semiconductor product therein with styrol foam or like material.

A problem in the prior art techniques is that the upper and lower packaging device halves, which are assembled together as mean of accommodating semiconductor wafers either after cutting or after polishing for storage or transport, have different shapes. These device halves are designed separately and, as a whole, they require at least two different dies, which is undesired in view of economy.

In another aspect, the packaging device requires a certain mechanical strength to withstand shocks experienced during transport. To meet this requirement, the device is made of a hard material. In addition, to protect the accommodated wafers from breakage, cushioning members of styrene foam, urethane, etc. are also accommodated. Further, wafer carriers for setting wafers therein are prepared separately from the upper and lower device halves.

Usually, the cushioning members, wafer carriers and upper and lower device halves are re-used. In other words, they are replenished with when they are broken, and it is necessary to manage their spares, requiring broad stock areas, which is uneconomical. A still further drawback is that empty devices have to be transported in the same state as when transporting wafers, so that they are rather bulky.

SUMMARY OF THE INVENTION

An object of the invention is to provide a semiconductor crystal packaging device, which can accommodate not only semiconductor wafers but also semiconductor ingots, and also which comprises two, i.e., upper and lower, device halves but does not require separate dies for these device halves.

Another object of the invention is to provide a semiconductor crystal packaging device, which does not require preparation of any separate wafer carrier to be provided in it.

A further object of the invention is to provide a semiconductor crystal packaging device, which does not require any wafer support spring for protecting wafers from breakage due to external shocks.

A yet further object of the invention is to provide a semiconductor crystal packaging device, which is not required to be transported in an empty state with the lower device half covered by the upper one.

Yet further, in view of global environment sanitation problems and restrictions of used and discarded box-like materials, it is a further object of the invention to provide a semiconductor crystal packaging device, which is made of a material capable of re-cycling.

It is a yet another object of the invention to provide a cushioning material made of a material capable of recycling, which is to be put between an end face of semiconductor crystal and a mate face of the packaging device to prevent movement of the accommodated semiconductor in the device when the semiconductor has an insufficient dimension in the longitudinal direction of the device.

To attain the above objects of the invention, a semiconductor crystal packaging device, particularly a non-polished semiconductor wafer packaging device, is provided, which comprises a pair of device halves as respective one-piece moldings and used as an upper and a lower device half, respectively. The device halves are engaged and sealed together with semiconductor crystal accommodated in them by engaging together their horizontal edge walls, so that the semiconductor crystal can be stored or transported.

The pair device halves each has a horizontal edge wall surrounding the opening of a substantially semi-circular sectional profile central recess, the horizontal edge wall being formed at desired positions thereof with a protuberance and a recess in point symmetry therewith. The horizontal edge walls of the two device halves are engaged together by engaging the protuberances and recesses thereof with one another, thereby forming an accommodation space for accommodating semiconductor crystal.

The device halves have the same shape having substantially a semi-circular sectional profile recess and are used as an upper and a lower device half, respectively, and they are engaged through mutual engagement of their horizontal edge walls, thereby forming an accommodation space for accommodating semiconductor crystal therein. Thus, there is no need of preparing two separate dies for the respective upper and lower device halves, nor is there a need of preparing a separate die for a wafer carrier. This is desired economically. In addition, it is necessary to manage and store device halves of only a single kind, and this is not cumbersome.

The device halves, in addition to having the protuberance formed on the horizontal edge wall and the recess also formed in the horizontal edge wall in point symmetry with respect to the protuberance and capable of being engaged with the protuberance of the other device half when the two device halves are engaged together, each further has an outwardly convex accommodation wall having elasticity for accommodating semiconductor crystal such that semiconductor crystal is pushed by the elasticity of the accommodation walls of the device halves when it is accommodated therein.

The device halves may further each have a pair of legs extending from the accommodation wall for accommodating semiconductor crystal therein, one of the legs having the bottom thereof having a protuberance, the other leg having the bottom thereof having a recess capable of being engaged with the protuberance of one of the pair device halves of another semiconductor crystal packaging device. In this case, a plurality of semiconductor crystal packaging devices accommodating semiconductor crystal can be stacked one above another by engaging the protuberances and recesses of the legs of associated device halves of adjacent devices with one another. In this state, relative longitudinal, transversal, or longitudinal and transversal movement of the devices can be prevented to permit stable storage or transport of semiconductor crystal.

When the device accommodating semiconductor crystal occasionally falls down from a certain height level, the legs can absorb the shock so that the shock is not directly exerted to the accommodated semiconductor crystal.

Where the device halves each have a vertical edge wall depending from the entire outer edge of the horizontal edge wall, an outwardly convex accommodation wall having elasticity for accommodating semiconductor crystal, and a plurality of legs provided on the opposite sides of the accommodation wall, the vertical edge walls of the two device halves accommodating semiconductor crystal therein may be secured to each other with an adhesive tape. In this case, it is possible to eliminate the possibility of detachment of the upper device half from the lower one to cause the accommodated semiconductor crystal to get out and be damaged when a shock is exerted to the device.

Moreover, the vertical edge wall and the legs can absorb externally exerted shocks to prevent damage to the accommodated semiconductor crystal. This effect is pronounced when the device as a whole is made of an elastic material.

A further feature of the invention resides in that the semiconductor crystal packaging device is made of polyethylene terephthalate (PET).

In June 1993, PET is designated as the second class designated good under the Recycling Material Law of Japan. Its combustion calorie is low, and it difficultly generates poisonous gases or materials. Thus, it can be readily recycled. Furthermore, it has high gas barrier property with respect to oxygen and like gases, and it can be suitably used for sealed vessels.

A further feature of PET is that its glass transition temperature is as high as 70° C., and it permits a transparent product to be obtained by quickly cooling its molding by reducing the die temperature to be below that temperature. Such a product, even with a small thickness, is superior in mechanical strength and wear resistance to such plastics as polypropyrene or polyethylene, and can well absorb external shocks.

A further merit of PET is that it can be molded by the vacuum molding process using an aluminum die. Besides, no separate die for a wafer carrier has to be prepared, which is economical. Moreover, it is necessary to store device halves of only a single kind, which is not cumbersome.

In a further structure of the device embodying the invention, the device halves each has raised guides and recessed guides formed on and in the horizontal edge wall, a protuberance and a recess formed on and in the horizontal edge wall in point symmetry with each other so as to be capable of being engaged, respectively compressively and non-compressively, with the recess and protuberance of the other device half when the two device halves are engaged together, and a recessed accommodation wall for accommodating semiconductor crystal therein.

With this structure, when the device halves are engaged together, their relative position is determined by the engagement of the raised guides and recessed guides with one another. In addition, the device halves are reliably secured together since the protuberances and recesses are engaged to one another in a compressive fashion. When the device halves are secured together in this way, semiconductor crystal can be snugly accommodated therein by the elastic forces of the accommodation walls.

Where the device halves each have a pair of legs extending from an accommodation wall for accommodating semiconductor crystal therein, one of the legs having the bottom thereof having a protuberance, the other leg having the bottom thereof a recess capable of being engaged with the protuberance of one of the pair device halves of another semiconductor crystal packaging device, it is possible to stack a plurality of semiconductor crystal packaging devices accommodating semiconductor crystal one above another by causing engagement of the protuberances and recesses of the legs of associated device halves of adjacent devices with one another. In this state, relative longitudinal, transversal, or longitudinal and transversal movement of the devices can be prevented to permit stable storage or transport of semiconductor crystal. When the device occasionally falls from a certain height, the shock can be absorbed by the legs and are not directly exerted to the accommodated semiconductor crystal.

A vertical edge wall which depends from the outer edge of the horizontal edge wall, also serves like the legs to absorb external shocks to prevent damage to the accommodated semiconductor crystal.

In a further feature of the semiconductor crystal packaging device according to the invention, which comprises a pair of device halves having a recessed accommodation wall and used as an upper and lower device half, respectively, to seal semiconductor crystal inside by engaging together horizontal edge walls of the device halves for storage or transport of the semiconductor crystal, a cushioning member is provided between an end face of the semiconductor crystal and a corresponding wall of the device to prevent rocking of the semiconductor crystal so as to prevent damage to the semiconductor crystal due to collision of semiconductor crystal pieces caused by such rocking. When the cushioning member is made of PET noted above, it can well absorb external shocks. In this case, since the cushioning member is made of the same material as the device halves, it can be readily recycled via the same route as the device halves.

The cushioning member may be used together with a wafer retainer to be mentioned later.

In each device half of the device according to the invention, an arcuate sectional profile wall facing the edge of accommodated semiconductor crystal and side walls extending along the opposite side of the arcuate sectional profile wall, are formed such that they flare toward the opening and thus can be readily separated from the die in manufacture. However, the short side walls of the device half that face the end faces of the accommodated semiconductor crystal are difficult to separate from the die, if they extent upright to match the semiconductor crystal end faces.

Therefore, the short end walls have to be slanted by a predetermined angle. In this case, a wedge-like space is formed between each semiconductor crystal end face and each short side wall. Such a wedge-like space may cause tilting or mutual collision of semiconductor crystal pieces, particularly wafers, which may cause breakage of the wafers.

A further feature of the invention is that a wafer retainer, which has a convex shape complementary to the wedge-like space and serves to position and hold the semiconductor crystal pieces upright, is provided between each semiconductor crystal end face and each corresponding inner wall of the device.

The wafer retainer is suitably made of polyethylene terephthalate like the device halves.

The wafer retainer may have a raised portion on its surface facing a semiconductor crystal end face and having a cushioning function when it is in contact with the semiconductor crystal. In this case, the safety of upright holding and the positioning and holding capacity can be reinforced. For stably positioning and holding the semiconductor crystal end face, the wafer retainer is formed on its side facing the short side wall of the device half with a contact surface capable of being in plane contact with the device half wall. The contact surface is suitably formed with an escape space or recess for escape from the device half wall. In this case, the wafer retainer can be readily deformed.

BRIEF DESCRIPTION OF THE DRAWINGS

FIG. 20 is a view similar to FIG. 10 but showing a modification of the device having a wafer retainer provided between each semiconductor crystal end face and each corresponding device wall;

FIG. 23 is a perspective view showing a further example of the wafer retainer;

FIG. 24 is a front view showing the FIG. 23 wafer retainer; and

BEST MODES OF CARRYING OUT THE INVENTION

Figure 3:
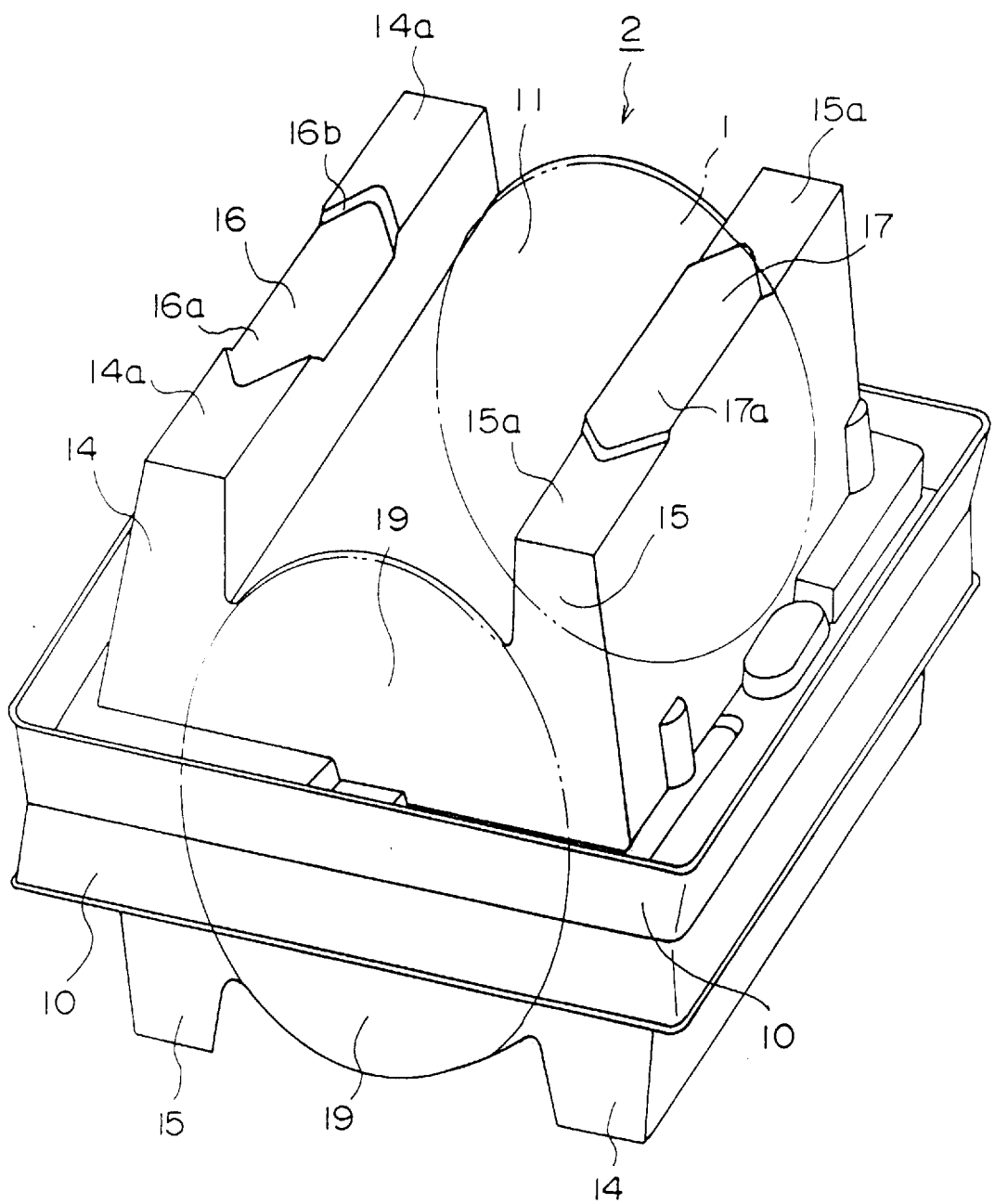
FIG. 3 is a perspective view showing pair device halves of the embodiment accommodating wafers therein.

FIG. 3 perspectively shows a semiconductor crystal packaging device according to the invention in a state accommodating wafers. In this state, the semiconductor crystals are stored or transported. As illustrated, the device comprises a pair of device halves having the same shape, which are one-piece moldings and used as an upper and a lower device half, as will be described later in detail. The device halves are engaged with each other by holding them with their open edges (or banks) aligned to each other and turning the upper device half 180 degrees relative to the lower device half.

Each device half 2 will now be described.

Figure 1:
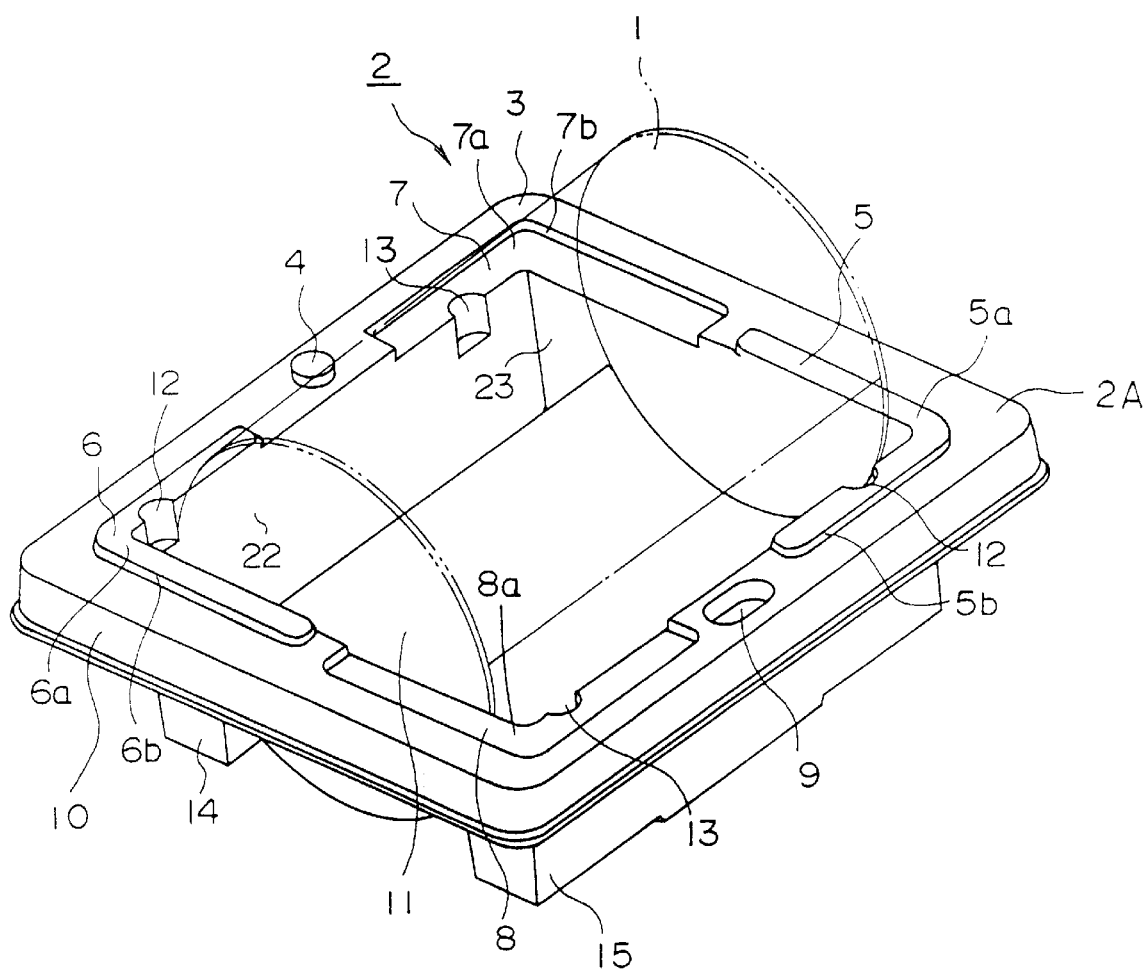
FIG. 1 is a perspective view showing a device half of an embodiment of the semiconductor crystal packaging device according to the invention accommodating wafers.

Referring to FIG. 1, the device half 2 is molded from polyethylene terephthalate (hereinafter referred to as PET) by a vacuum molding process using an aluminum die. It has a substantially rectangular shape like a lunch box having a short side length of 135 mm and a long side length of 153 mm. It is open on the side opposite its paired legs 14 and 15, and its wall thickness is approximately 1 mm. Its molding is carried out by setting the die temperature to the transition temperature of glass (70° C.) or below to obtain a transparent molding.

The device half 2, as shown, is a thin molding, and it is excellent in the mechanical strength and shock-resistant property and can well absorb externally exerted shocks.

The device half 2 is described in further details. It has an open recess having a substantially semicircular sectional profile, which is defined by an arcuate sectional profile wall 11, paired long side walls 22 slightly flaring from vertical as one goes toward the opening and terminating in the respective legs 14 and 15, and paired short side walls 23 slightly flaring from vertical toward the opening. The device half 2 further has an edge wall 2A surrounding the entire edge of the opening of the recess.

Figure 7:
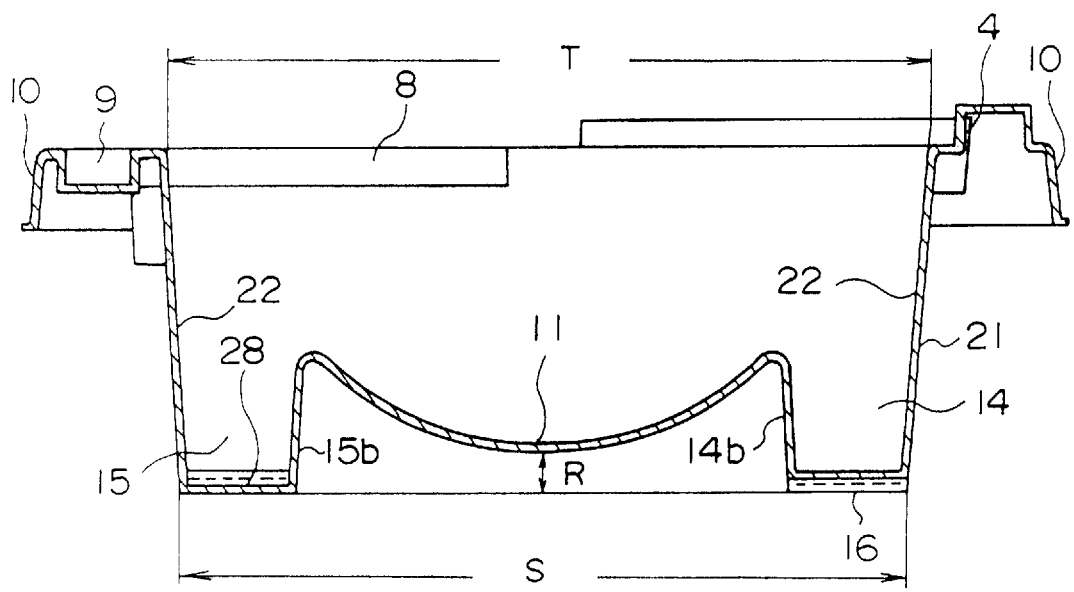
FIG. 7 is a sectional view taken along line A—A in FIG. 5.
Figure 8:
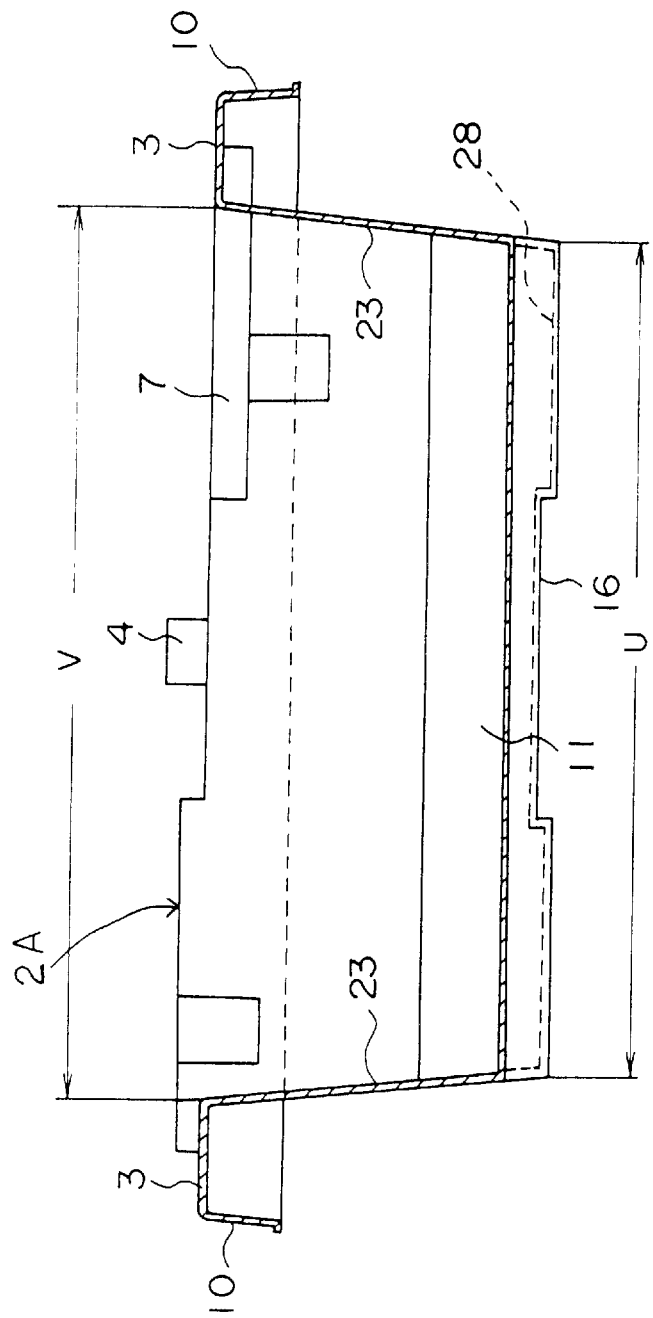
FIG. 8 is a sectional view taken along line B—B in FIG. 5.

As shown in FIGS. 7 and 8, the short and long side walls 23 and 22 are slanted for flaring toward the opening of the recess so that the short side dimension T of the recess opening is greater than the outer edge-to-edge distance S between the bottoms of the legs 14 and 15 and that the long side dimension V of the recess opening is greater than the long side dimension U of the bottom of the legs 14 and 15. The edge wall 2A is substantially L-shaped in sectional profile having a horizontal portion 3 surrounding the recess opening and having a width of approximately 8.5 mm and a vertical portion 10 extending in a slightly flaring fashion from the outer edge of the horizontal portion 3 and having a width of 10 mm.

Figure 4:
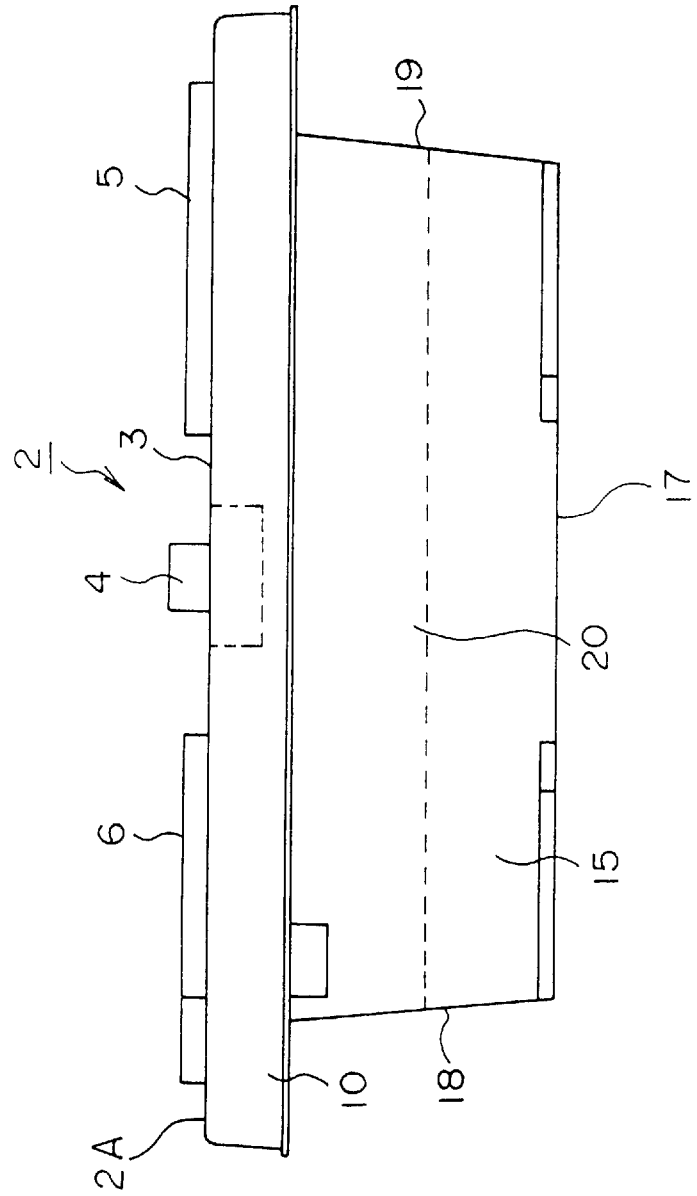
FIG. 4 is a front view showing one device half of the embodiment.
Figure 6:
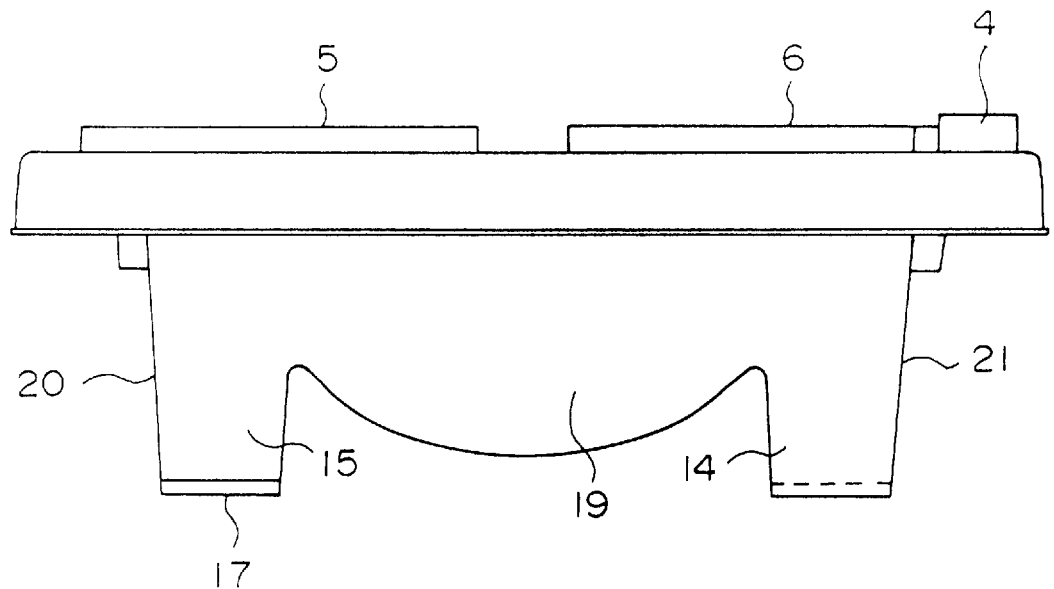
FIG. 6 is a right side view of one device half of the embodiment.

FIGS. 4 and 6 are a front view and a right side view, respectively, showing the device half 2 in the embodiment of the invention. As is seen from these Figures, the vertical portion 10 of the edge wall 2A is flange-like and spaced apart outward by about 20 mm from the outer surfaces 19 and 20 of the legs 14 and 15 over the entire circumference of the recess opening.

The distance dimension from the bottom surface to the opposite edge 3 of the legs 14 and 15 is set to about 46 mm.

Figure 5:
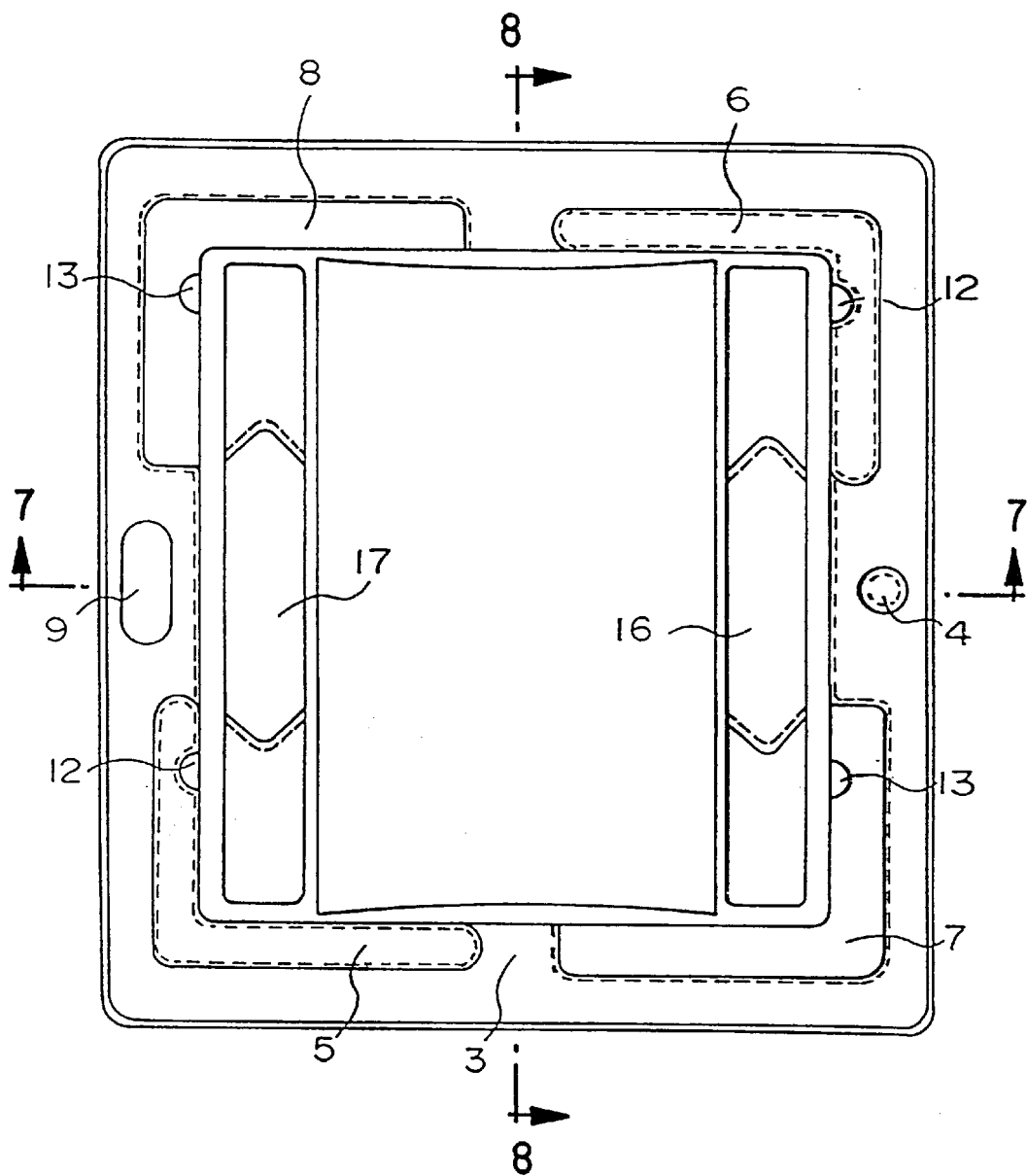
FIG. 5 is a plan view showing one device half of the embodiment.

As shown in FIG. 1, the edge wall horizontal portion 3 has its left long side portion formed near the center with a circular protuberance 4 having a diameter of about 9.5 mm (see FIG. 4), and also has its right long side portion formed near the center with an oval recess 9 having a depth greater than the height of the protuberance 4 and a width smaller than the diameter of the protuberance 4, i.e., about 8.8 mm (see FIGS. 4 and 5).

When the pair device halves 2 are engaged together, the protuberance 4 of each of them is engaged in the oval recess 9 of the other. At this time, the protuberance 4 elastically deforms the recess 9 and is given a compressive force. The pair device halves 2 are thus firmly engaged and secured together.

The edge wall horizontal portion 3 has a pair of its opposite corners each formed with respective L-shaped raised guides 5 and 6 of like shape (see FIGS. 4 and 5). The L-shaped raised guides 5 and 6 have their inner surfaces flush with the inner surfaces of the walls 22, 22' and 23, 23' and have a height of about 3.5 mm and a width of 2.5 mm.

The long side walls 22, 22' have semi-cylindrical reinforcement recess portions 12 extending from the top surfaces 5a and 6a of the raised guides 5 and 6 and open on their inner side.

The edge wall horizontal portion 3 also has the other pair of its opposite corners each formed with respective L-shaped recessed guides 7 and 8 of like shape (see FIGS. 7 and 8). The L-shaped recessed guides 7 and 8 have bottoms 7a and 8a with a depth from the top of the horizontal portion 3 slightly greater than the height of the raised guides 5 and 6 and side surfaces 7b and 8b capable of engagement with side surfaces 5b and 6b of the L-shaped raised guides 5 and 6 (see FIG. 2).

The long side walls 22, 22' also have semi-cylindrical reinforcement recess portions 13, 13' extending from the bottoms 7a and 8a of the L-shaped recessed guides 7 and 8 and open on their inner side.

The reinforcement recess portions 12 and 13 of the walls 22, 22' are raised from the outer surfaces 20 and 21 of the legs 14 and 15. They are raised to a constant extent over their length from the slanted outer surfaces 20 and 21 of the legs 14 and 15, that is, they have a fixed height over their length from the outer surfaces 20 and 21.

The legs 14 and 15 of the device half 2 connect the short side walls 22, 22' thereof and support the device half 2 on the surface on which the device half 2 is placed.

As shown in FIGS. 6 to 8, the legs 14 and 15 are rectangular in shape and support the opposite sides of the arcuate sectional profile wall 11 which will be described later in detail.

As shown in FIG. 7, the leg 14 has an inner wall 14b extending away from the outer surface 21 from its bottom, and the leg 15 has an inner wall 15b extending away from the outer surface 22 from its bottom. The inner walls 14b and 15b of the legs 14 and 15 terminate in the arcuate sectional profile wall 11.

FIG. 3 shows the pair device halves 2 engaged together. As shown, the leg 14 is formed near the center with a recess 16 for stacking having arrow-like opposite end surfaces 16b, and the leg 15 has a raised portion 17 for stacking formed at a position corresponding to the recess 16.

The raised portion 17 has slightly smaller dimensions than the recess 16 to permit stacking of devices accommodating wafers 1 with its engagement with the associated recess 16 of a device half 2 of an adjacent device.

The bottom 16a of the recess 16 and the top 15a of the leg 15 are at the same level, and the top 17a of the raised portion 17 and the top 14a of the leg 14 are at the same level.

As shown in FIGS. 5 to 8, the arcuate sectional profile wall 11 extends between the two legs 14 and 15 and also between the opposite short side walls 23 (FIG. 1). It is raised toward and spaced apart a distance R from the surface on which the device half 2 is placed. Its inner diametric dimension is set to be slightly smaller than the outer diameter of the wafers 1 accommodated so that it can push the edge of the wafers 1 with its elastic force when the device halves 2 are engaged together with the wafers 1 accommodated therein.

The functions of the embodiment having the structure as described above will now be described.

As shown in FIG. 1, a plurality of wafers 1 are closely set upright on the arcuate sectional profile wall 11 of the device half 2 between the short side walls 23, 23' thereof. It is possible as well to set an ingot having the same length as the plurality of closely set wafers noted above.

If the number of wafers or length of ingot set in the arcuate sectional profile wall 11 is insufficient, suitable cushioning materials may be provided appropriately at the opposite ends of the wafer row or the ingot to prevent the movement thereof in the longitudinal direction.

Figure 2:
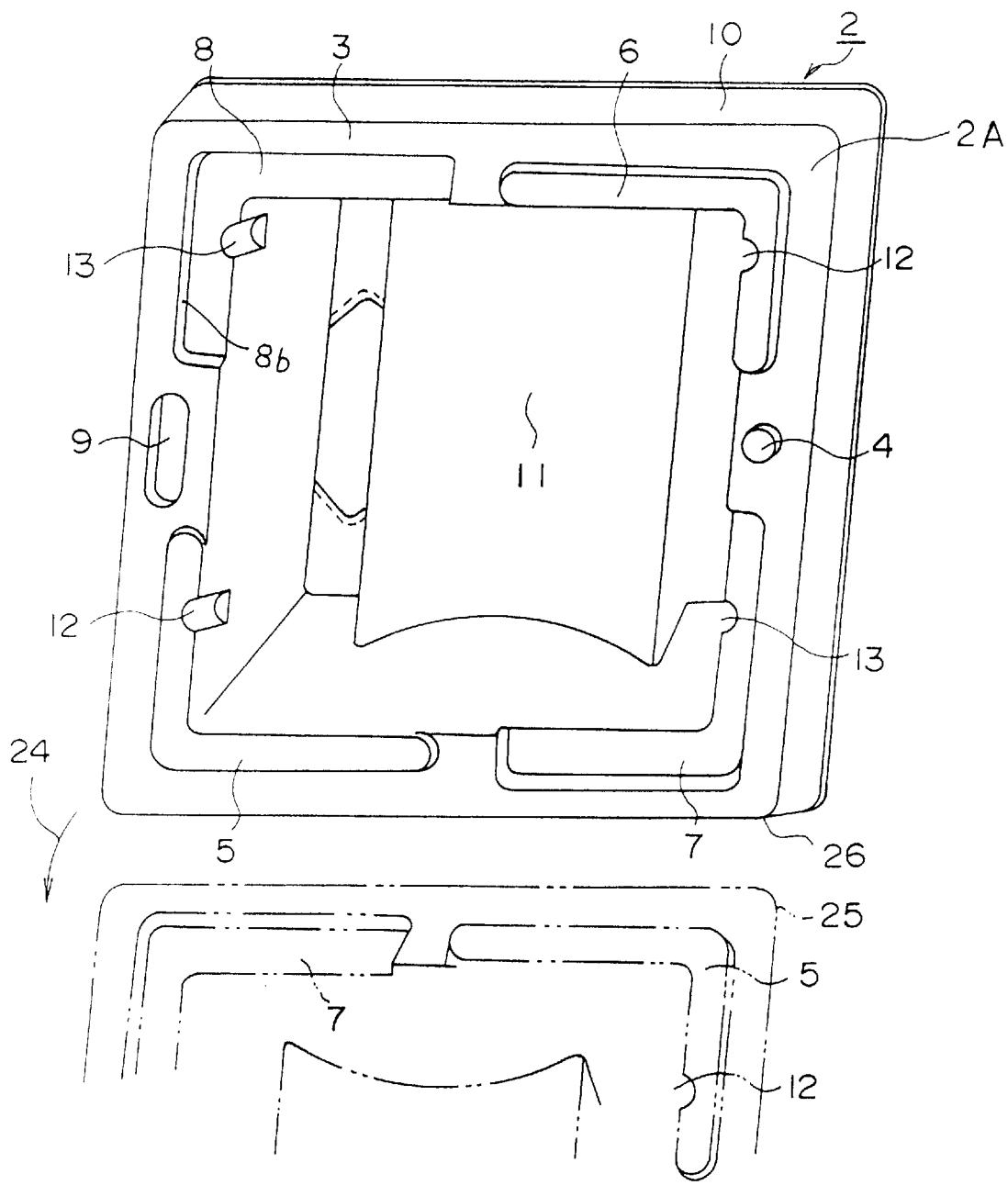
FIG. 2 is a perspective view of a device half of the embodiment to cover the wafers.

Subsequently, as shown in FIG. 2, the other device half 2 which is empty is set such that the edge line 25 of the horizontal and vertical portions 3 and 10 of the edge wall 2A is parallel to that 26 of the device half 2 with the wafers 1 set therein so that its L-shaped raised and recessed guides 5 and 7 corresponds to the recessed and raised guides 7 and 5 of the filled device half 2, and in this state the other device half 2, i.e., the empty device half 2, is turned in the direction of arrow 24. As a result, the L-shaped raised and recessed guides 5 and 7 provided at the corners of the two device halves 2 are engaged with one another, while the protuberances 4 are engaged in the oval recesses 9 having a slightly smaller width with a compressive force exerted by spreading the recesses 9 in the width direction. In this way, the wafers 1 set in one of the device halves 2 is covered by the other.

The raised guides 5 and 6 and recessed guides 7 and 8 engage one another and serve as positioning guides.

The accommodated state of the wafers 1 obtained in this way can be observed because the device halves 2 are transparent moldings of PET.

Figure 9:
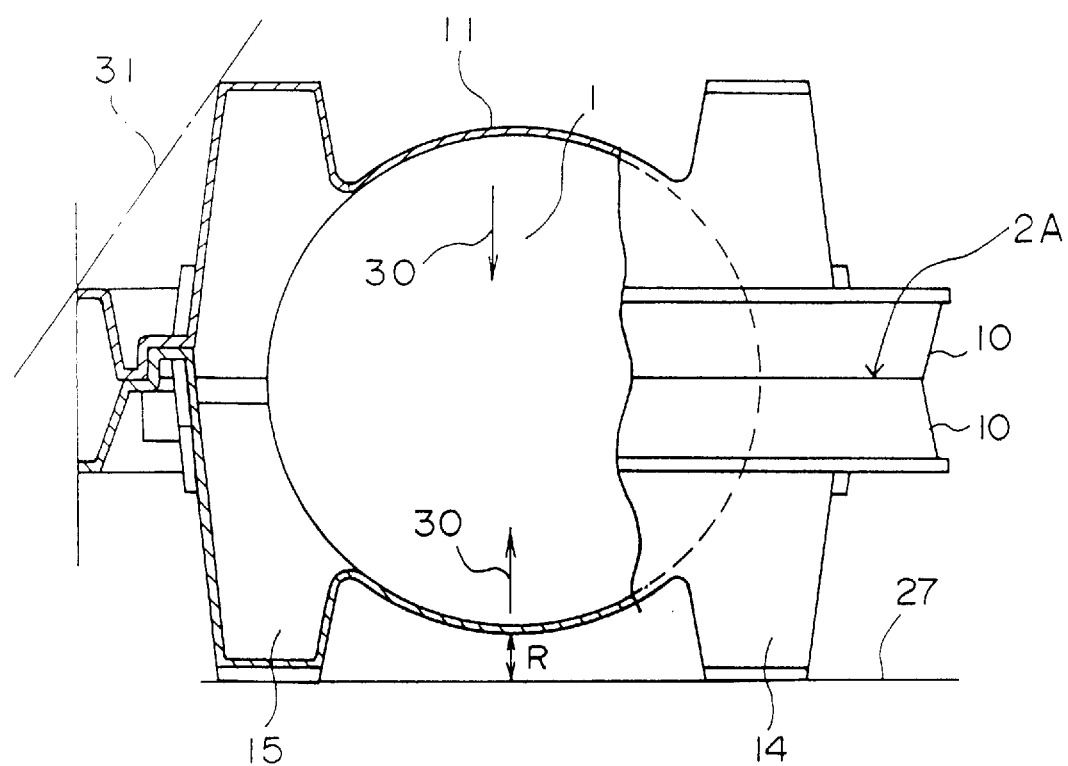
FIG. 9 is a side view, partly broken away, showing the device halves of the embodiment that are engaged together while accommodating wafers.
Figure 10:
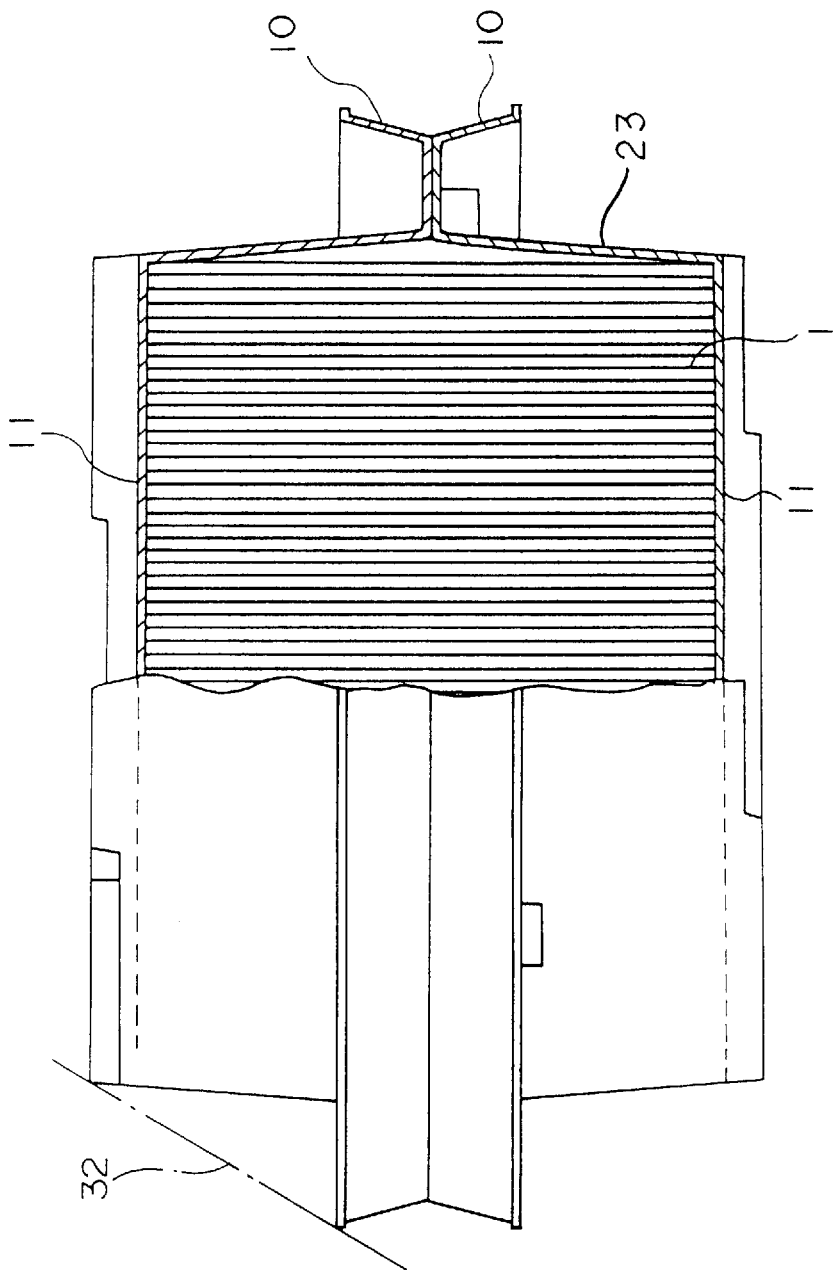
FIG. 10 is a front view, partly broken away, showing the device halves of the embodiment that are engaged together while accommodating wafers.

FIGS. 9 and 10 show the state of accommodation of the wafers 1 obtained by covering the wafers with the other device half 2 as shown in FIG. 3. In this state, the wafers 1 are pushed in the directions of arrows 30 as shown in FIG. 9 by the elastic force of PET and secured in position because the inner diameter of the arcuate sectional profile wall 11 is slightly smaller than the outer diameter of the wafers 1.

The force of engagement of the two device halves 2 accommodating the wafers 1 therein, is attributable to the compressive force of engagement between the protuberances 4 and oval recesses 9 provided in the edge wall vertical portions 3. The vertical edge wall portions 10 of the two device halves 2 form the same plane, and thus they can be tied together with an adhesive tape. When they are tied together with adhesive tape, the two device halves 2 are not detached from each other by a shock exerted to them.

Figure 11:
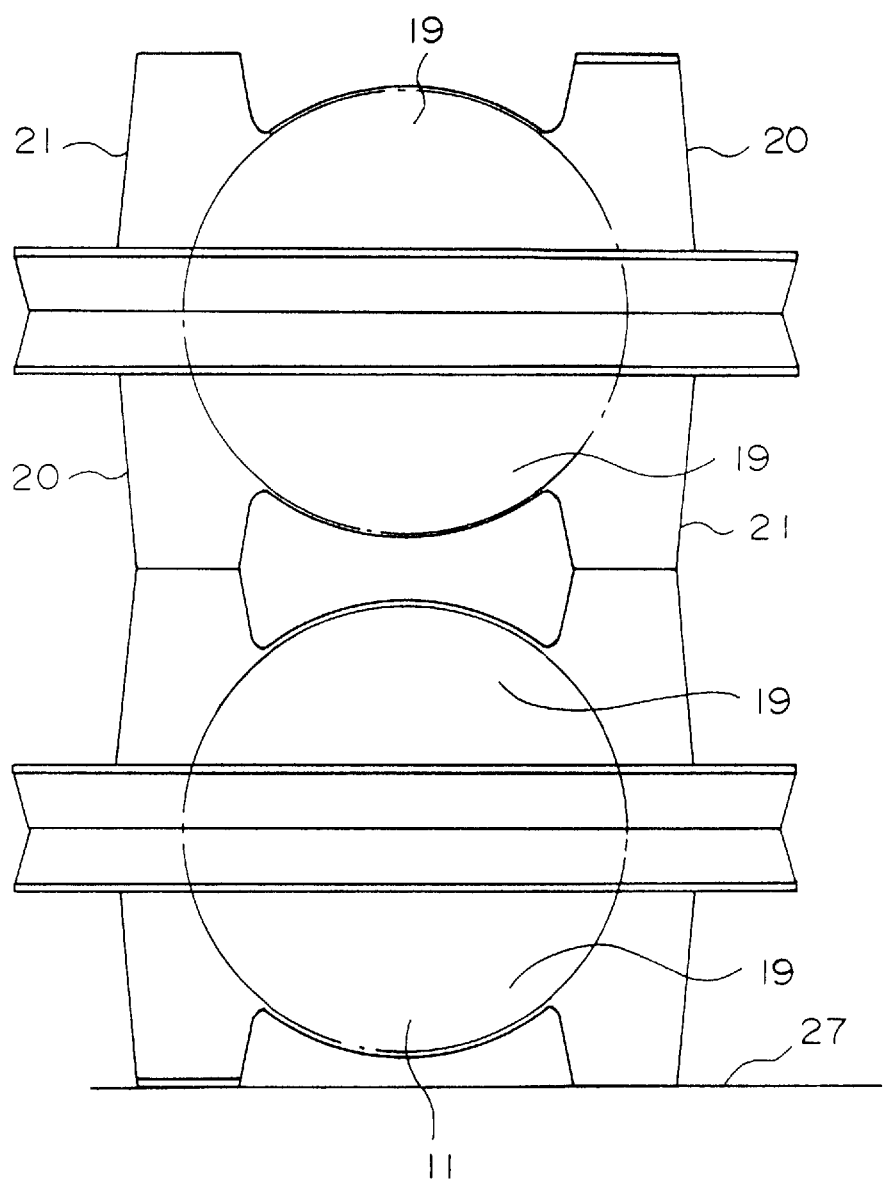
FIG. 11 is a view showing a vertical stack of two semiconductor crystal packaging devices accommodating wafers therein.

As shown in FIG. 11, the devices each comprising a pair of device halves 2 accommodating wafers 1 therein can be stacked together for storage or transport with the engagement of the recess 16 and raised portion 17 for stacking of one device half 2 of each device with those of the corresponding device half 2 of the adjacent device.

In this state, relative longitudinal or transversal movement of the devices shown in FIG. 11 is restricted by the recesses 16 and raised portions 17 in engagement with one another, thus permitting stable storage or transport of the stacked devices. Since the most raised portion of the arcuate sectional profile wall 11 is spaced apart a distance R from the surface 27 of support of the device half 2 as shown in FIG. 9, vertical shock forces can be absorbed by the legs 14 and 15 while longitudinal and transversal shock forces are absorbed by the vertical edge wall portion 10, and the wafers 1 thus can be transported safely.

When the device half 2 accommodating the wafers 1 is turned down during transport, it may strike a floor surface as shown by line 31 or 32 in FIG. 9 or 10. Even in such case, the device half 2 can absorb shock forces with the legs 14 and 15 and vertical edge wall portion 10 to prevent damage to the accommodated wafers 1.

While this embodiment is described such that the vertical edge wall portion 10 has a width of about 10 mm, this is by no means limitative; for example, the vertical edge wall portion 10 may extend up to be level with the top 14a of the leg 14 or the top 17a of the raised portion 17 as shown in FIG. 3. In this case, external shock forces externally applied in the longitudinal and transversal directions can be absorbed more satisfactorily.

Figure 12:
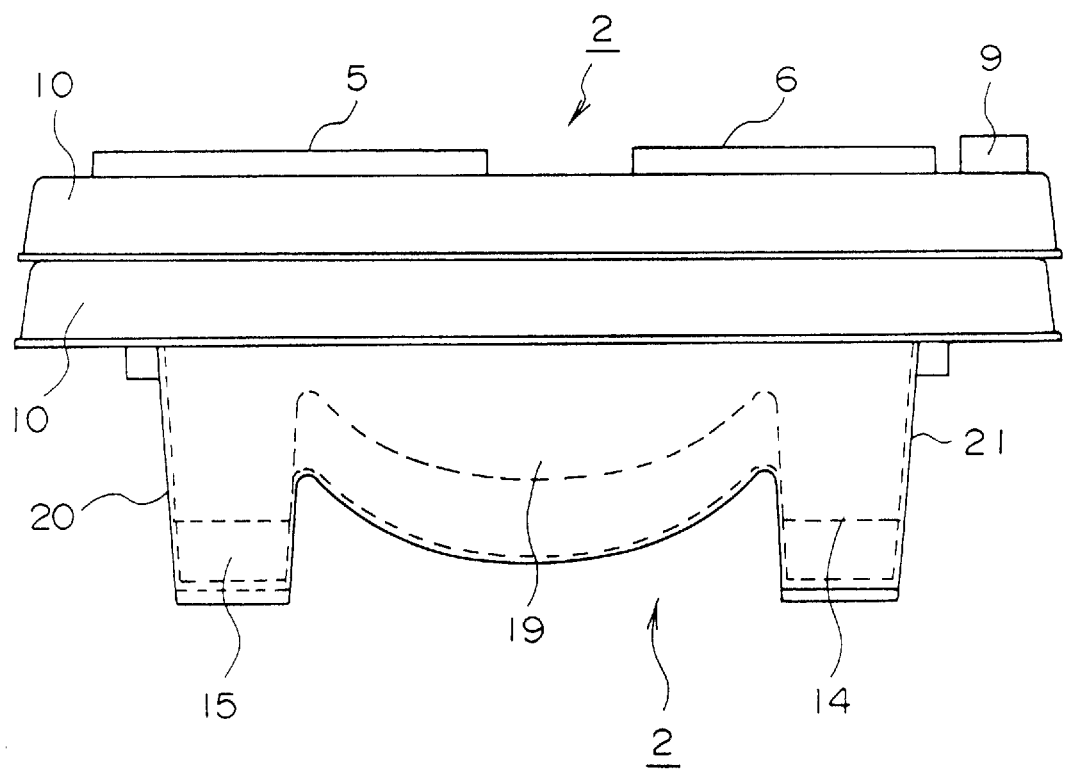
FIG. 12 is a view showing empty device halves stacked together in the embodiment of the invention.
Figure 13:
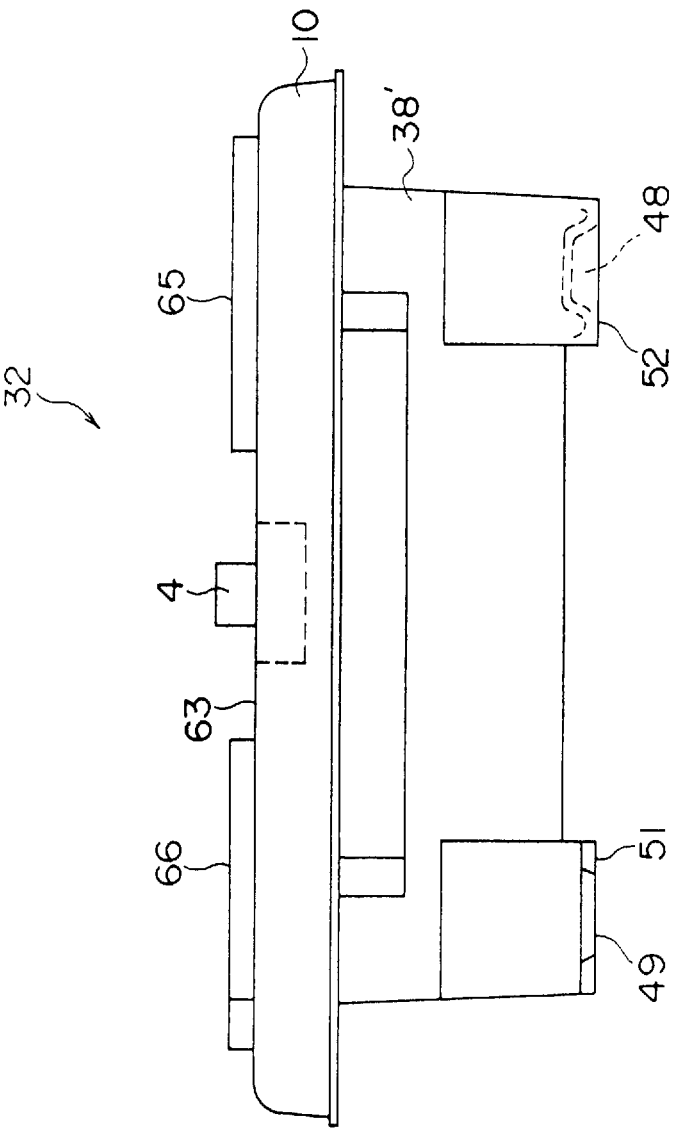
FIG. 13 is a front view showing a second embodiment of the semiconductor crystal packaging device.
Figure 14:
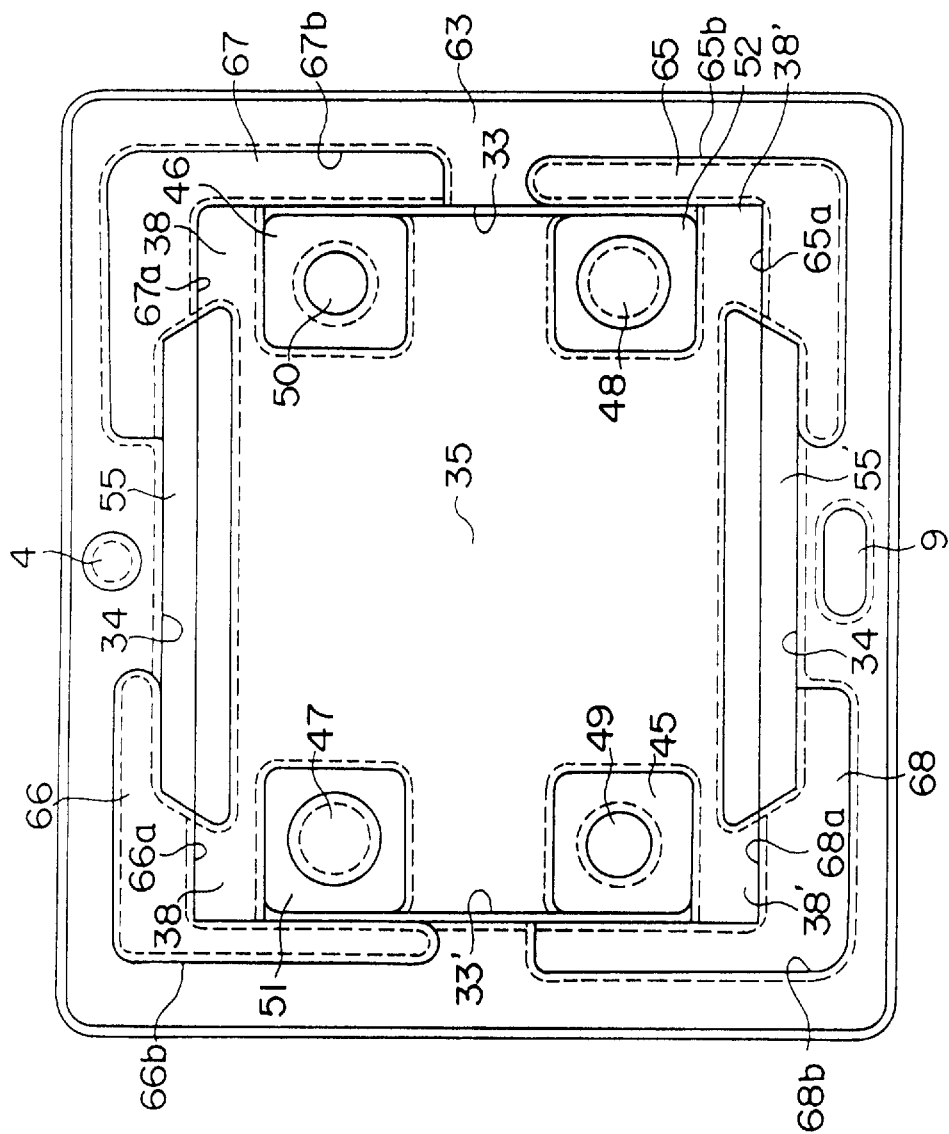
FIG. 14 is a plan view showing one device half of the FIG. 13 embodiment.
Figure 15:
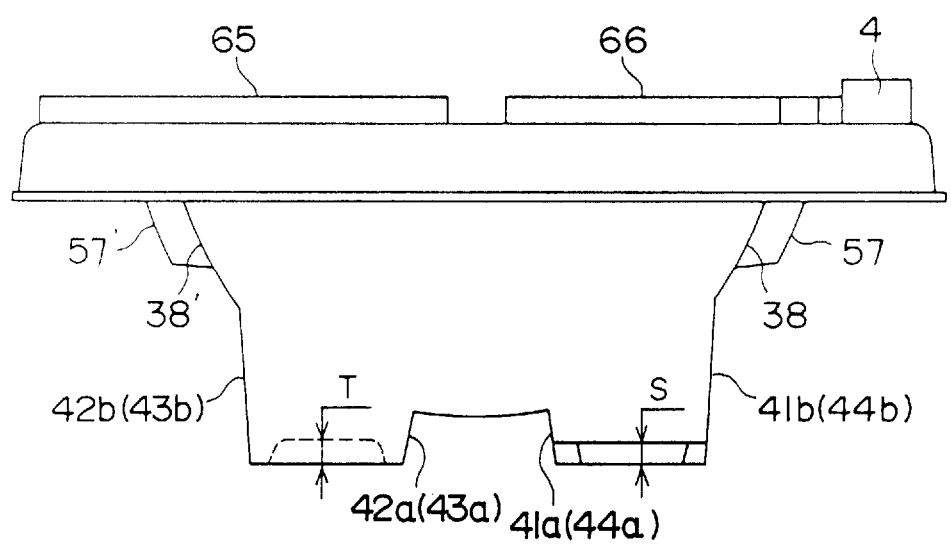
FIG. 15 is a left side view showing one device half of the FIG. 13 embodiment.
Figure 17:
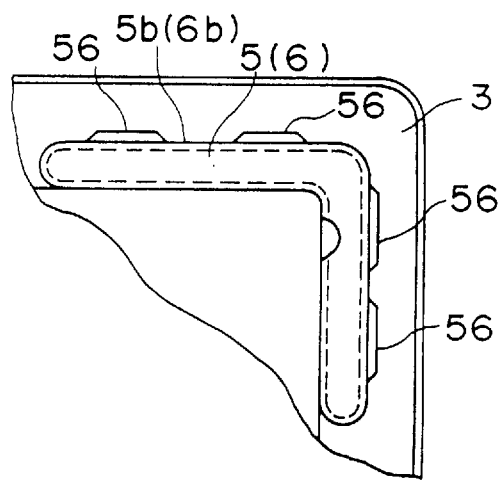
FIG. 17 is a fragmentary plan view showing a different example of engaging means of the device according to the invention.

FIG. 13 is a front view showing one half of a second embodiment of the semiconductor crystal accommodation device according to the invention, FIG. 14 is a plan view showing the same, FIG. 15 is a left side view showing the same, and FIG. 17 is a perspective view showing the same embodiment assembled with wafers accommodated therein. Same shape parts as those in the previous first embodiment shown in Figures up to FIG. 12 are designated by like reference numerals and symbols.

Again the second embodiment of the device is made of PET. In this embodiment of the semiconductor crystal packaging device, horizontal edge wall portion 63, ridges 65 and 66 and recesses 67 and 68 formed on and in the edge wall portion 63, protuberance 4, oval recess 9, and vertical edge wall portion 10 are the same in shape as those of the device half 2 in the first embodiment.

Like the first embodiment, the device half 32 has short side walls 33 and 33' and long side walls 34 and 34', which flare such that their edge dimensions at the opening defined by the horizontal edge wall portion 63 are greater than the bottom.

Like the first embodiment, the device half 32 has an arcuate sectional profile wall 35 which is convex downward and spaced apart by a distance R from the device half support surface (FIG. 15).

While in the first embodiment device half 2 the edge of wafers is received by the arcuate sectional profile wall 11 and has its outer portions supported by the legs 14 and 15 extending from the opposite side edges of the arcuate sectional profile wall 11 when the wafers are set in the device half, in the second embodiment device half 32 the edge of wafers is received by the arcuate sectional profile wall 35 and opposite side extensions 38 and 38' therefrom when the wafers are set. Thus, compared to the first embodiment, legs 41 to 44 are located to support inner wafer edge portions corresponding in extent to the wafer edge portions received by the extensions 38 and 38'.

Figure 16:
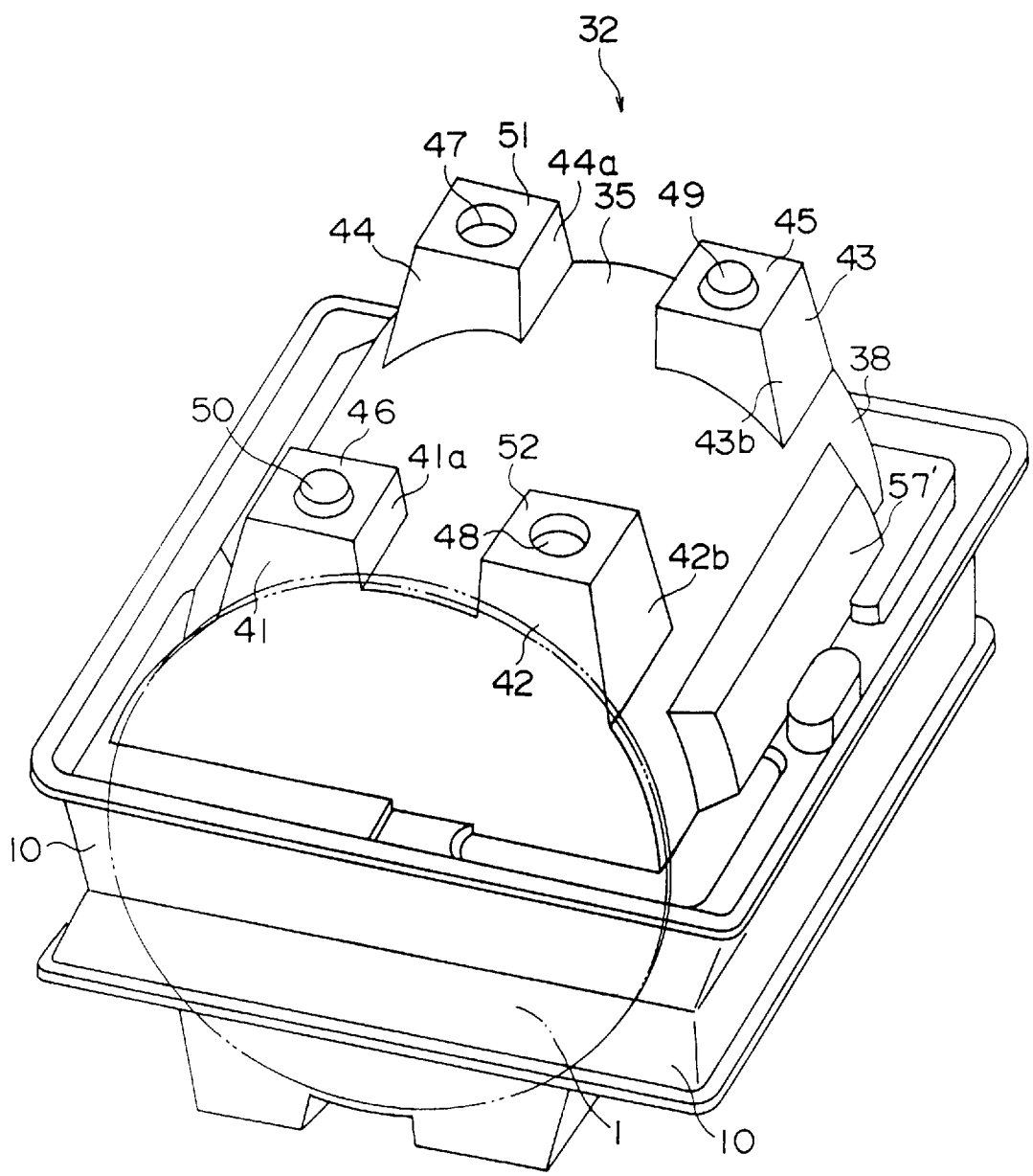
FIG. 16 is a perspective view showing the device halves of the FIG. 13 embodiment engaged together.

With the first embodiment device half 2 vertical external shocks are received by the inner surface of the arcuate sectional profile wall 11 and the inner walls 14b and 15b of the legs 14 and 15 supporting the wall 11 (FIG. 7) as is seen from FIG. 3, with the second embodiment device half 32 vertical external shocks are received and distributed to the inner surfaces of the arcuate sectional profile wall 35 and the extensions 38 and 38' therefrom as is seen from FIG. 16.

More specifically, the external vertical shocks are received by the inner surface of the arcuate sectional profile wall 35, inner walls of the legs 41 to 44 and outer walls 41b to 44b thereof supporting the extensions 38 and 38'. This means that the external shocks are distributed to a greater extent corresponding to the outer walls 41b to 44b of the legs 41 to 44 supporting the extensions 38 and 38', and the mechanical strength of the device half is correspondingly increased.

The tops or bottoms 46 and 45 of the legs 41 and 43 have protuberances 50 and 49, while the tops or bottoms 52 and 51 of the other legs 42 and 44 have recesses 48 and 47 for stacking having a shape capable of engagement with the protuberances 49 and 50 for stacking of a different device half (see FIG. 16).

The tops 52 and 51 of the legs 42 and 44 and the protuberances 49 and 50 for stacking are in the same plane and at an equal distance from the vertical edge wall portion 63.

While in the first embodiment device half 2 the long side walls 22, 22' have the reinforcement recessed portions 12, 12' and 13, 13', in the second embodiment the extensions 38 and 38' have outer arcuate sectional profile projections 57 and 57' (FIG. 15). The projections 57 and 57', as shown in FIG. 14, are shown as reinforcement ribs 55 and 55' formed as recessed portions from the neighborhood of the legs 41 to 44. As shown in FIG. 15, they are at a predetermined distance from the extensions 38 and 38'.

The outer surfaces 65b and 66b of L-shaped raised guides 65 and 66 and the inner surfaces 67b and 68b of L-shaped recessed guides 67 and 68, provided on and in the horizontal edge wall portion 63, are the same in shape as in the first embodiment.

In the second embodiment having the above construction, like the first embodiment, the two device halves 32 are used as an upper and a lower device half, respectively. Wafers 1 to be accommodated are set as a row in the arcuate sectional profile wall 35 and extensions 38 and 38' serving as wafer accommodation part of the lower device half. Then, the upper and lower device halves 32 are engaged together by engaging the raised guides 65 and 66 and recessed guides 67 and 68 with one another and also engaging the protuberances 4 and oval recesses 9 with one another. In this way, the wafers are accommodated in the device. The accommodated wafers are pushed and secured in position by the elastic force of PET since the arcuate sectional profile wall 35 has an inner diametric dimension smaller than the wafer diameter. The accommodated wafers can be visually recognized because the device halves 32 are made of PET.

The force of engagement of the two device halves 32 accommodating the wafers is attributable to the engagement force of the protuberances 4 and oval recesses 9 received by the counterpart horizontal edge wall portions 63. The vertical edge wall portions 10 of the two device halves 32 engaged together lie in the same plane and may be tied together using a tape. When they are tied together with tape, the upper device half is not detached from the lower one in case of tumbling of the device.

Like the first embodiment as shown in FIG. 11, devices each comprising the pair device halves 32 accommodating wafers can be stacked for storage or transport by engaging the recesses 48 and 47 and protuberances 49 and 50 for stacking of mate device halves of adjacent devices with one another.

In this second embodiment, like the first embodiment as shown in FIGS. 9 and 10, and shock exerted in the event of tumbling can be absorbed by the vertical edge wall portion 10 and legs 41 to 44. Like the first embodiment, the vertical edge wall portion 10 may extend up to the level of the top of the protuberances 49 and 50 for stacking shown in FIG. 16. With this arrangement, longitudinal and transversal external shocks can be absorbed more satisfactorily.

FIG. 17 shows a different example of the engaging means for engaging together the two device halves by covering the lower device half accommodating wafers with the upper device half.

In this case, side surfaces 5b and 6b of L-shaped raised guides 5 and 6 have protuberances 56, which can engage with inner surfaces 7b and 8b of L-shaped recessed guides 7 and 8 to effect engagement of the two device halves with each other. It will be seen that the two device halves can be engaged together by spreading the L-shaped recessed guides 7, and the protuberance 4 and oval recess 9 may be dispensed with.

Figure 18:
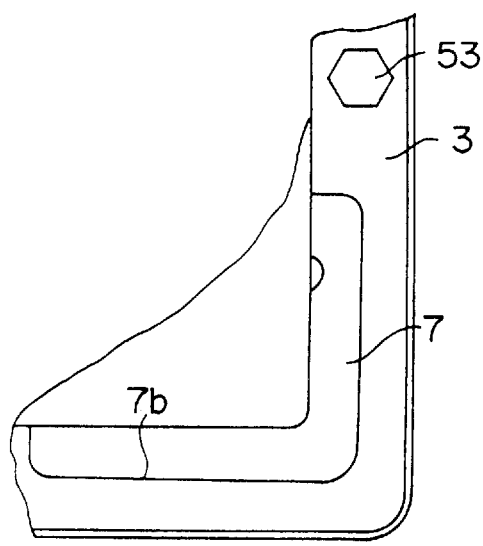
FIG. 18 is a fragmentary plan view showing a further example of the engaging means.

FIG. 18 shows a further example of the engaging means for engaging together the two device halves. In this case, a polygonal protuberance 53 having a greater diagonal dimension than the width of oval recess 9 is provided. It is possible to provide a star-shaped protuberance instead of the polygonal one.

Figure 19A:
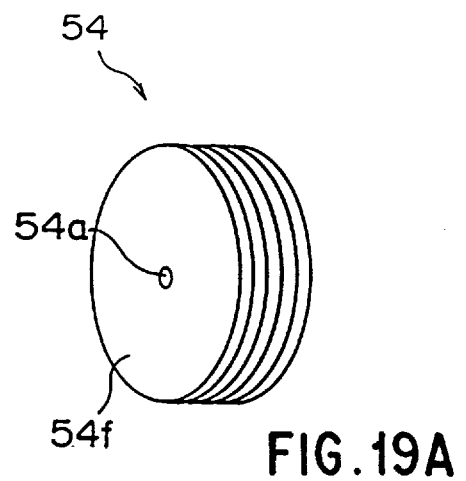
FIG. 19 shows in a perspective view in (A) and in a side view in (B) a cushioning member provided in the device according to the invention.
Figure 19B:
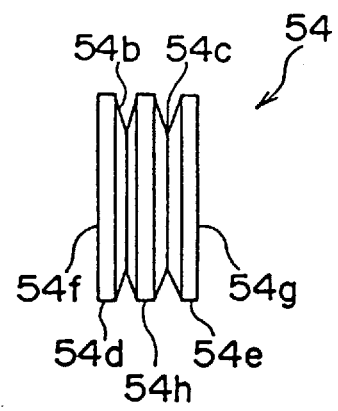
Figure 21:
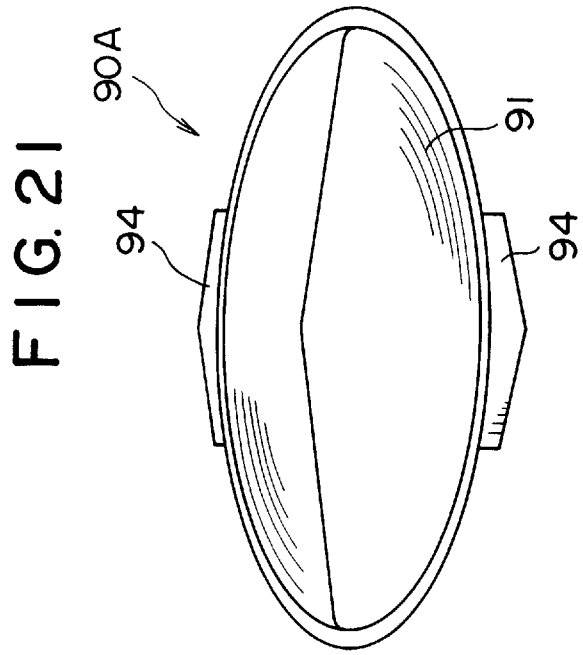
FIG. 21 is a perspective view showing an example of the wafer retainer.

FIG. 19 shows a cushioning material 54, which may be used when an insufficient number of wafers are set upright in a row in the arcuate sectional profile wall. The cushioning material 54 is put in the vacant space to prevent movement of the wafers in the longitudinal direction of the arcuate sectional profile wall.

The cushioning material 54 is made of PET, the same material as the device halves 2 accommodating the wafers. It has a shape like an accordion having large diameter portions 54d, 54e and 54h and small diameter portions 54b and 54c. One of its end faces, i.e., end face 54f, is formed with an air vent hole 54a. Its thickness is increased by pulling the large diameter portions 54d and 54e away from each other and is reduced by pushing the end faces 54f and 54g toward each other. In the former case, air is introduced through the air vent hole 54a, and in the latter case air is withdrawn.

In the device halves 2 of the first embodiment, as shown in FIG. 20, the arcuate sectional profile wall 11 and long side walls 22 which face the circular edge of semiconductor product, are formed in a flaring fashion toward the opening and are thus capable of being readily separated from the die. However, it is difficult to separate the short side walls 23, which are to face the end faces of the wafer row, from the die if these walls extend upright so that they match the end faces of the wafer row.

Therefore, the short side walls 23 are slightly slanted. This means that a wedge-like space 80 is defined between each end face of the wafer row and the associated short side wall 23. Such wedge-like spaces 80 cause tilting and mutual colliding of wafers in them, thus causing damage to the wafers.

In this embodiment, a wafer retainer 90 which has an outer shape corresponding to that of the wedge-like space 80 and serving to hold the accommodated wafers 1 upright, is provided between each end face of the wafer row and the associated short side wall 23.

The wafer retainer 90 has to be provided for each longside wall 23 of the device half.

The wafer retainer 90 is suitably a hollow molding of PET, the same material as the device halves.

Figure 22:
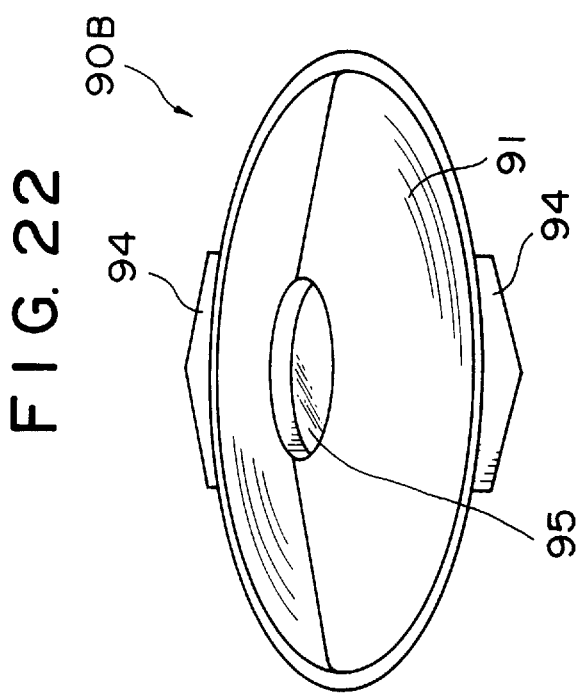
FIG. 22 is a perspective view showing a different example of the wafer retainer.

FIGS. 22 to 24 show examples of the wafer retainer 90. The side of the wafer retainer that is in contact with the short side wall 23 of the device half is referred to as the front side.

FIG. 22 shows a disc-like wafer retainer 90A, which has a flattened conical front side surface 91 formed in correspondence to the wedge-like space 80. Its back side surface to be in contact with a wafer row end face is made upright, or is formed with a slightly raised portion 92 having a cushioning function as shown in FIG. 25.

Figure 25:
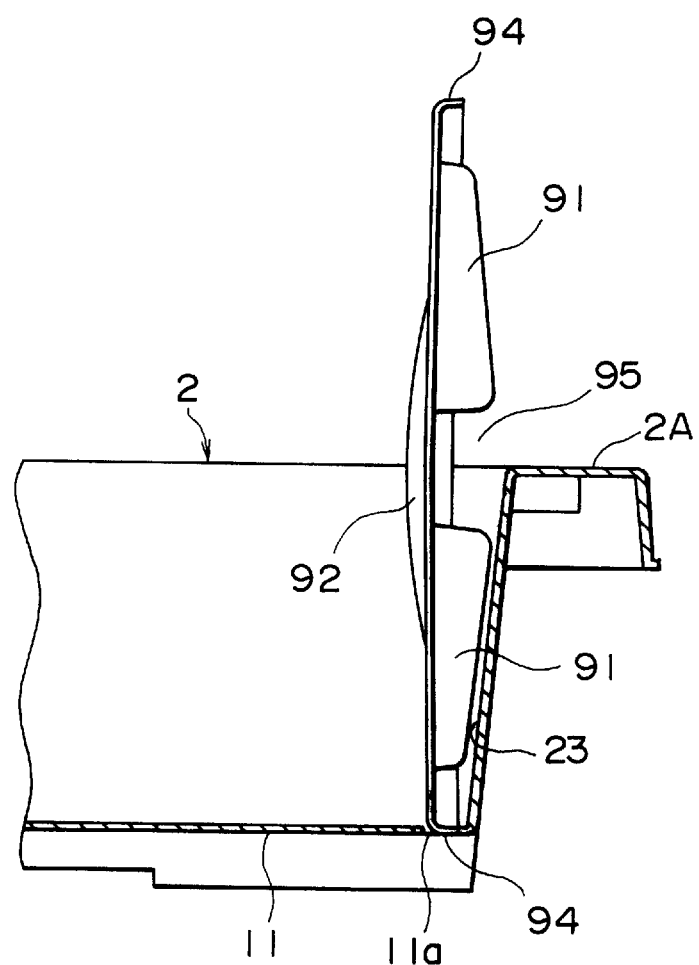
FIG. 25 is a fragmentary sectional view showing the FIG. 23 wafer retainer.

FIG. 25 shows the back side of the wafer retainer which has a left and a right radially outer extension 93 having a guide ridge 94 serving as a positioner to position accommodated in the wafer accommodation part of the device half 2.

It is possible to form the device half 2 with positioning grooves, in which the guide ridges 94 can be engaged.

The front side surface 91 of the wafer retainer is formed conically so that it snugly fits either short side wall 23. With this arrangement, the entire surface 91 is in contact with the short side wall 23, and no escape space is provided. That is, in this case the wafer retainer may be deformed abnormally in the wedge-like space 80 so that it can no longer be used.

In the wafer retainer 90B shown in FIG. 22, the front side surface 91 is formed with a central recess 95 serving as an escape space when it is in contact with the short side wall 23.

FIG. 23 shows a further wafer retainer 90C. The front side surface 91 of this wafer retainer has a central recess 95, a wide straight recess 96 passing through the central recess 95 and left and right rectangular recesses 97 formed on the opposite sides of the straight recess 96.

With the FIG. 25 wafer retainer 90, the back surface of which in contact with an end face of semiconductor crystal is formed with raised portion 92 having a cushioning function, the raised portion 92 is in contact with a predetermined pushing force with the semiconductor crystal end face, thus reinforcing the stability of the upright holding and the retaining function.

As shown above, according to the invention two device halves having the same shape and having a wafer accommodation space are engaged together to accommodate wafers in them. Thus, it is necessary to prepare only a single kind of die, which is economical. The vertical edge wall portion and the legs can absorb external shocks for safe storage or transport of wafers.

The walls 22 of the device half are slanted such that they flare toward the horizontal edge wall portion. This means that a plurality of empty device halves can be stacked in like orientation as shown in FIG. 12. In this case, the volume occupied is one-third of the volume when the device halves are accommodating wafers. It is thus possible to save space necessary for storing or transporting empty device halves, which is economical.

While in the above description the device halves were described to be entirely made of transparent PET, this is by no means limitative; the device halves may be partly transparent or entirely opaque.

A transparent portion that may be provided in at least the arcuate sectional profile wall in which wafers are accommodated is more effective for it permits visual recognition of wafers.

According to the invention, the cushioning member 54 and wafer retainer 90 that are made of the same material as the device halves pretent tilting or rattling of the accommodated wafers.

INDUSTRIAL UTILITY OF THE INVENTION

As has been described in the foregoing, two device halves having the same shape are used to accommodate wafers in them by engaging them together. Thus, it is necessary to prepare only a single kind of die, and also it is necessary to store only a single kind of device halves. In addition, the stack space of device halves can be reduced, and it is possible to provide a semiconductor crystal packaging device, which permits economical storage or transport of semiconductor crystal.

Moreover, using PET as the material of the device halves, cushioning member and wafer retainer ensures obtaining excellent mechanical strength and wear resistance, so that these parts are difficult to be damaged or broken during transport and also can be recycled, which is suitable in view of the global environment protection measures with importance attached thereto particularly recently.

What is claimed is:

1. A semiconductor crystal packaging device comprising a pair of device halves, wherein each device half has:

a horizontal edge wall;

raised guides and a protuberance formed on the horizontal edge wall;

recessed guides and a recess formed in the horizontal edge wall in point symmetry with each other so as to be engageable with the raised guides and protuberance of the other device half when the two device halves are engaged together;

a strip-like vertical edge wall depending from the outer edge of the horizontal edge wall;

an outwardly convex accommodation wall defining a substantially semi-circular sectional profile recess for accommodating semiconductor crystal therein;

legs provided on bottom portions of the accommodation wall; and reinforcement raised portions projecting from outer walls of the legs;

the protuberance and recesses of the two device halves being engageable with one another compressively to accommodate semiconductor crystal in the device halves thus engaged together.

2. A semiconductor crystal packaging device comprising a pair of device halves made of an elastic material, wherein each device half has:

a horizontal edge wall;

raised guides and a protuberance formed on the horizontal edge wall;

recessed guides and a recess formed in the horizontal edge wall in point symmetry with the raised guides and the protuberances so as to be engageable compressively with the raised guides and protuberance of the other device half when the two device halves are engaged together;

a strip-like vertical edge wall depending from the outer edge of the horizontal edge wall;

an outwardly convex accommodation wall defining a substantially semi-circular sectional profile recess for accommodating semiconductor crystal therein;

legs provided on bottom portions of the accommodation wall; and reinforcement raised portions projecting from outer walls of the legs;

the protuberances and recesses of the two device halves being engageable with one another compressively to accommodate semiconductor crystal in the device halves thus engaged together.

3. A semiconductor crystal packaging device for packaging a number of wafers after slicing and before polishing directly in close contact with one another in a substantially cylindrical semiconductor wafer stack, comprising:

an upper and a lower device half made of thin resin sheet, said upper and lower device halves each having an identical shape, each of said device halves including:

a substantially semi-circular sectional profile central recess extending concave from an open end toward a bottom, the substantially semi-circular sectional profile central recess being defined by an outwardly convex semi-circular sectional profile accommodation wall having a diameter equal to or less than the diameter of the substantially cylindrical semiconductor wafer stack;

a pair of legs depending from the opposite side portions of the semi-circular sectional profile accommodation wall toward the bottom thereof and having a greater height than the semi-circular sectional profile accommodation wall; and a protuberance and a recess formed on and in the outer surface of a horizontal edge wall surrounding the opening of the central recess;

wherein the cylindrical semiconductor wafer stack is accommodated between the semi-circular sectional profile accommodation walls of the upper and lower device halves, respectively, with the recess and the protuberance of the upper device half being engaged with the protuberance and the recess of the lower device half, respectively.

4. The semiconductor crystal packaging device according to claim 3, further comprising a cushioning material interposed between an axial end face of the cylindrical semiconductor wafer stack and an inner longitudinal end face of the semi-circular sectional profile accommodation wall.

5. The semiconductor crystal packaging device according to claim 4, wherein the cushioning material has an accordion-like shape defining an interior air space, and has an air vent section communicating said interior air space with the ambient atmosphere outside said cushioning material.

6. The semiconductor crystal packaging device according to claim 3, which further comprises a semiconductor crystal retainer for positioning and holding the wafers of the cylindrical semiconductor wafer stack upright, the semiconductor retainer being interposed between an axial end face of the cylindrical semiconductor wafer stack and an inner longitudinal end face of the semi-circular sectional profile accommodation wall.

7. The semiconductor crystal packaging device according to claim 6, wherein the semiconductor crystal retainer has a convex portion on a side facing the cylindrical semiconductor wafer stack end, the semiconductor crystal retainer being in cushioning contact with the cylindrical semiconductor wafer stack.

8. The semiconductor crystal packaging device according to claim 6, wherein the device halves and the semiconductor crystal retainer are made of thin polyethylene terephthalate sheets.

9. The semiconductor crystal packaging device according to claim 6, wherein the semiconductor crystal retainer has a contact surface to be in plane contact with a corresponding inner longitudinal end face of the semi-circular sectional profile accommodation wall, the contact surface having an escapement section for escapement from the inner longitudinal end face.

10. The semiconductor crystal packaging device according to claim 3, wherein said semi-circular sectional profile accommodation wall has a constant cross-section throughout an axial length thereof.

* * * * *